US012812774B2

(12) United States Patent
Yang et al.

(10) Patent No.: US 12,812,774 B2
(45) Date of Patent: Nov. 24, 2026

(54) FLEXIBLE PRINTED CIRCUIT BOARD, DISPLAY MODULE, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Peng Yang, Beijing (CN); Haotian Yang, Beijing (CN); Xiaoliang Fu, Beijing (CN); Zan Luo, Beijing (CN); Mingqiang Wang, Beijing (CN); Xueying He, Beijing (CN)

(73) Assignees: CHENGDU BOE OPTOELECTRONICS TECHNOLOGY CO., LTD., Chengdu (CN); Beijing BOE Technology Development Co., Ltd., Beijing (CN)

( * ) Notice: Subject to any disclaimer, the term of this patent is extended or adjusted under 35 U.S.C. 154(b) by 238 days.

(21) Appl. No.: 18/697,333

(22) PCT Filed: Aug. 9, 2023

(86) PCT No.: PCT/CN2023/111903
§ 371 (c)(1),
(2) Date: Mar. 29, 2024

(87) PCT Pub. No.: WO2024/046064
PCT Pub. Date: Mar. 7, 2024

(65) Prior Publication Data

US 2024/0407082 A1 Dec. 5, 2024

(30) Foreign Application Priority Data

Sep. 2, 2022 (CN) ........................ 202211072771.2

(51) Int. Cl.
*H05K 1/11* (2006.01)
*H05K 1/02* (2006.01)
(Continued)

(52) U.S. Cl.
CPC ............ *H05K 1/028* (2013.01); *H05K 1/115* (2013.01); *H05K 1/118* (2013.01); *H05K 5/0018* (2022.08);
(Continued)

(58) Field of Classification Search
CPC ...... H05K 1/028; H05K 5/0018; H05K 1/115; H05K 1/118; H05K 5/03; H05K 2201/10128
(Continued)

(56) References Cited

U.S. PATENT DOCUMENTS

2018/0263109 A1* 9/2018 Chen .................... H05K 1/0221
2021/0296421 A1* 9/2021 Moon ................. G06F 3/04164
2022/0240386 A1* 7/2022 Li .......................... H05K 1/189

FOREIGN PATENT DOCUMENTS

CN 110196652 A 9/2019
CN 112230795 A 1/2021
(Continued)

*Primary Examiner* — Binh B Tran
(74) *Attorney, Agent, or Firm* — WHDA, LLP

(57) ABSTRACT

The present disclosure relates to a flexible printed circuit board comprising a first region extending along a first direction, wherein the first region comprises a binding area and a track area arranged adjacent to each other along the first direction, at least one side of the binding area is provided with a conductive functional area along a second direction, the conductive functional area is electrically connected to a grounding wire in the track area for grounding, and the second direction is arranged at an angle to the first direction; the flexible printed circuit board comprises a substrate layer, and the conductive functional area comprises
(Continued)

two conductive layers located on at least one side of the substrate layer, and the two conductive layers are electrically connected with each other through a via hole. The present disclosure also relates to a display module and a display device.

14 Claims, 2 Drawing Sheets

(51) Int. Cl.
*H05K 5/00* (2006.01)
*H05K 5/03* (2006.01)

(52) U.S. Cl.
CPC ..... *H05K 5/03* (2013.01); *H05K 2201/10128* (2013.01)

(58) Field of Classification Search
USPC .......................................................... 361/749
See application file for complete search history.

(56) References Cited

FOREIGN PATENT DOCUMENTS

| | | | |
|---|---|---|---|
| CN | 112860122 | A | 5/2021 |
| CN | 114793383 | A | 7/2022 |
| CN | 115426769 | A | 12/2022 |
| JP | 2004-079855 | A | 3/2004 |

* cited by examiner

FLEXIBLE PRINTED CIRCUIT BOARD, DISPLAY MODULE, AND DISPLAY DEVICE

CROSS-REFERENCE TO RELATED APPLICATIONS

This application claims priority to Chinese Patent Application No. 202211072771.2 filed in China on Sep. 2, 2022, the entire contents of which are incorporated herein by reference.

TECHNICAL FIELD

The present disclosure relates to the technical field of manufacturing display products, and more particularly, to a flexible printed circuit board, a display module, and a display device.

BACKGROUND

In the on-cell type of rigid-wearing OLED products, some end-user requirement TP (touch panel) functional components have a grounded design. Routine design ground route: TFPC GND wiring→TFPC exposed copper→conductive adhesive→SCF/NFC→MFPC (main flexible printed circuit board)→complete machine main board→metal middle frame/metal rear cover, or TFPC GND wiring→MFPC→complete machine main board→metal middle frame/metal rear cover.

For the former grounding route, the end point of the grounding route is generally metal middle frame/metal rear cover, and the efficiency and ESD resistance of grounding are relatively low; the latter grounding route requires that the TFPC and MFPC connector/ZIF locations be routed with additional GND lines, which generally means that larger connectors need to be used, which is disadvantageous both in terms of cost and space usage.

SUMMARY

In order to solve the above technical problem, the present disclosure provides a flexible printed circuit board, a display module, and a display device, which solve the problem of low grounding efficiency of the flexible printed circuit board.

In order to achieve the above object, the embodiments of the present disclosure adopt the following technical solutions. A flexible printed circuit board comprises a first region extending along a first direction, wherein the first region comprises a binding area and a track area arranged adjacent to each other along the first direction, at least one side of the binding area is provided with a conductive functional area along a second direction, the conductive functional area is electrically connected to a grounding wire in the track area for grounding, and the second direction is arranged at an angle to the first direction; and the flexible printed circuit board comprises a substrate layer, and the conductive functional area comprises two conductive layers located on at least one side of the substrate layer, and the two conductive layers are electrically connected with each other through a via hole.

Optionally, the binding area comprises a signal connection pin and a grounding pin located on at least one side of the signal connection pin in the second direction, the track area comprises a signal track connected to the signal connection pin and the grounding wire located on at least one side of the signal track in the second direction, and the grounding wire and the corresponding conductive functional area are located on a same side of the first region.

Optionally, the flexible printed circuit board comprises a substrate layer, a first conductive layer located in the first region, and a second conductive layer and a third conductive layer located in the conductive functional area;

the first conductive layer is located on a first side of the substrate layer and comprises the signal track, the signal connection pin, the grounding wire, and the grounding pin;

the second conductive layer is located on the first side of the substrate layer, and the second conductive layer is electrically connected to the grounding pin; and the third conductive layer is located on a second side of the substrate layer opposite the first side, and the third conductive layer and the second conductive layer are electrically connected through a via hole penetrating the substrate layer.

Optionally, an orthographic projection of the third conductive layer on the substrate layer at least partially overlaps an orthographic projection of the second conductive layer on the substrate layer.

Optionally, an insulating protective layer is provided on a side of the substrate layer remote from the first conductive layer.

Optionally, the first region and the conductive functional area are integrally connected in a T-shaped structure, the substrate layer comprises a first side edge away from the track area along the first direction, and along the first direction, the conductive functional area comprises a second side edge located on a same side as the first side edge, and the first side edge and the second side edge are flush.

Optionally, in the second direction, the binding area includes a plurality of spaced apart signal connection pins, the grounding pins being spaced apart from signal connection pins adjacent thereto.

Embodiments of the present disclosure also provide a display module comprising a display panel, a cover plate, and the above-mentioned flexible printed circuit board disposed between the display panel and the cover plate; and the flexible printed circuit board is bound and connected to the display panel, an edge of the cover plate is provided with a fourth conductive layer, and the conductive functional area of the flexible printed circuit board is electrically connected to the fourth conductive layer.

Optionally, the cover plate comprises a first surface facing the display panel, a second surface away from the display panel, and a first side surface located between the first surface and the second surface, wherein the first side surface is arranged close to the flexible printed circuit board, and the fourth conductive layer comprises a first sub-conductive layer arranged at an edge of the first surface close to the first side surface, a second sub-conductive layer arranged at the first side surface, and a third sub-conductive layer arranged at an edge of the second surface close to the first side surface; and the first sub-conductive layer, the second sub-conductive layer and the third sub-conductive layer are in a U-shaped structure.

Optionally, the cover plate comprises a light-transmitting region corresponding to the display area of the display panel, and a light-shading region located at the periphery of the light-transmitting region, an orthographic projection of the first sub-conductive layer on the cover plate is located in the light-shading region, and an orthographic projection of the third sub-conductive layer on the cover plate is located in the light-shading region.

Optionally, the flexible printed circuit board and the cover plate are connected via a conductive foam tape.

Optionally, the conductive foam tape has a height of 0.3-0.4 mm in a direction perpendicular to the cover plate.

Optionally, the orthographic projection of the conductive functional area of the flexible printed circuit board on the cover plate is located in an orthographic projection of the conductive foam tape on the cover plate.

Optionally, the display panel comprises a display substrate and a touch-control substrate located on a light-emitting side of the display substrate, and the flexible printed circuit board is bound and connected to the touch-control substrate.

Embodiments of the present disclosure also provide a display device including the display module described above.

Advantageous effects of the present disclosure are: through the arrangement of the conductive functional area, the grounding wire is guided to the cover plate, without increasing the volume of the connector between the flexible printed circuit board and the main flexible printed circuit board, shortening the grounding route and improving the grounding efficiency.

DETAILED DESCRIPTION

In order that the objects, technical solutions and advantages of the embodiments of the present disclosure will become more apparent, a more particular description of the embodiments of the present disclosure will be rendered by reference to the appended drawings. It is to be understood that the described embodiments are part, but not all, of the disclosed embodiments. Based on the embodiments of the present disclosure described, all other embodiments available to one of ordinary skill in the art are within the scope of the present disclosure.

In describing the present disclosure, It is to be noted that the terms "central", "upper", "lower", "left", "right", "vertical", "horizontal", "inner", "outer", and the like indicate orientations or positional relationships based on the orientations or positional relationships shown in the figures, merely to facilitate description of the present disclosure and simplify the description, and do not indicate or imply that the referenced devices or elements must have a particular orientation, be constructed and operated in a particular orientation, and thus should not be construed as limiting the present disclosure. Furthermore, the terms "first", "second", and "third" are used for descriptive purposes only and are not to be construed as indicating or implying relative importance.

Figure 1:
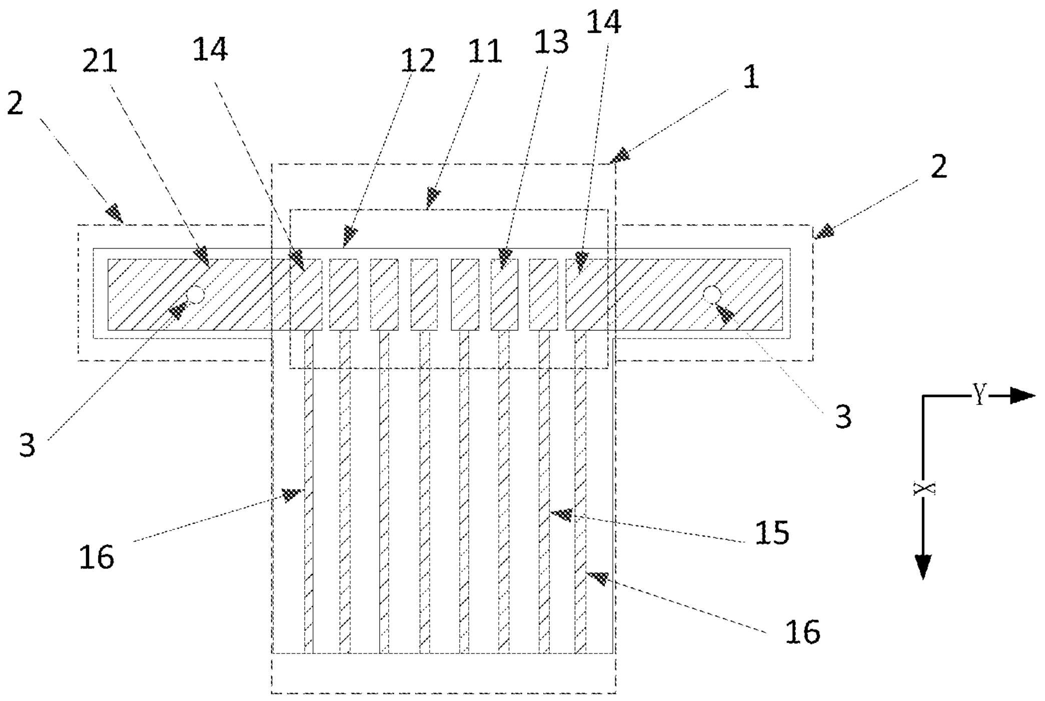
FIG. 1 shows a first schematic view of a flexible printed circuit board according to an embodiment of the present disclosure.
Figure 2:
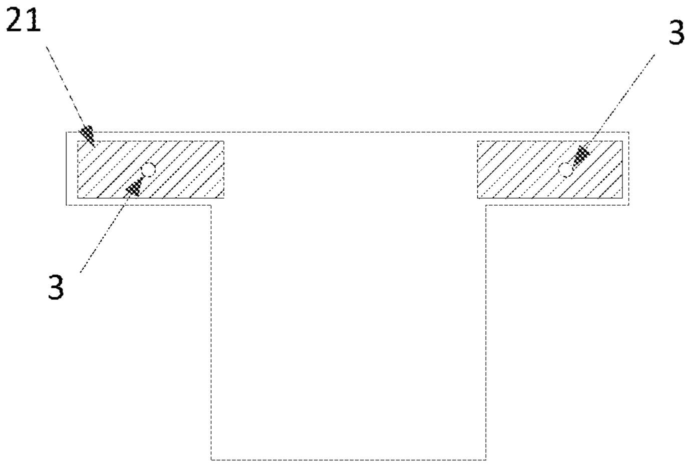
FIG. 2 shows a second schematic view of a flexible printed circuit board according to an embodiment of the present disclosure.
Figure 3:
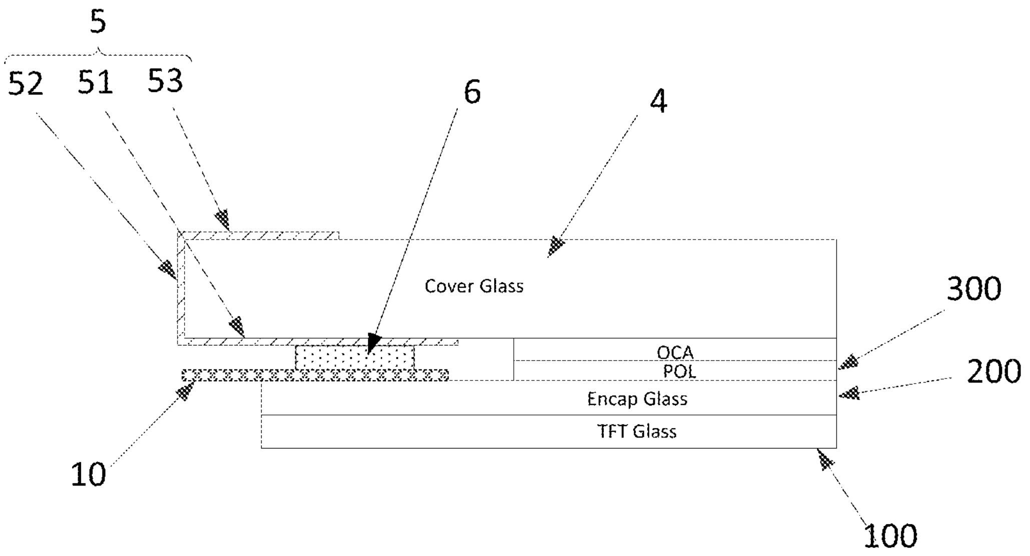
FIG. 3 shows a first schematic view of a display module according to an embodiment of the present disclosure.
Figure 4:
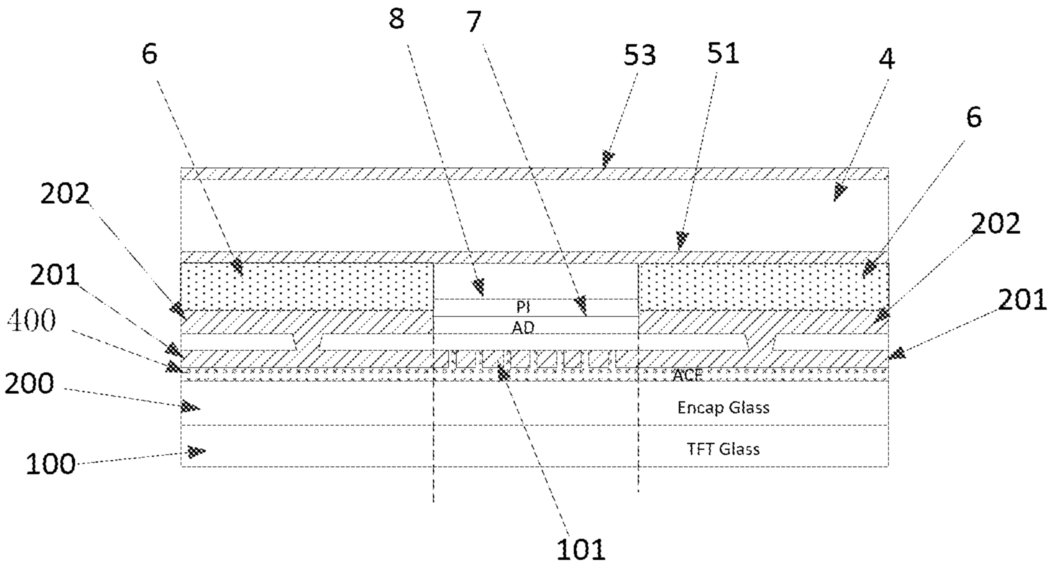
FIG. 4 shows a second schematic view of a display module according to an embodiment of the present disclosure.

With reference to FIGS. 1-4, the present embodiment provides a flexible printed circuit board 10, comprising a first region 1 extending along a first direction, wherein along the first direction (referring to an X direction in FIG. 1), the first region 1 comprises a binding area 11 and a track area arranged adjacent to each other, and along a second direction (referring to a Y direction in FIG. 1), at least one side of the binding area 11 is provided with a conductive functional area 2, the conductive functional area 2 is electrically connected to a grounding wire 16 in the track area for grounding, and the second direction is arranged at an angle to the first direction;

The flexible printed circuit board comprises a substrate layer 12, and the conductive functional area comprises two conductive layers located on at least one side of the substrate layer 12, and the two conductive layers are electrically connected through a via hole.

In the related art, the grounding wires of the flexible printed circuit board 10 generally have the following two types: TFPC GND wiring→TFPC exposed copper→conductive adhesive→SCF/NFC→MFPC→mainboard of complete machine→metal middle frame/metal rear cover, or TFPC GND wiring→MFPC→complete machine main board→metal middle frame/metal rear cover. Whatever the grounding route is longer, and in the latter grounding route, requiring the connector/ZIF position routing of TFPC and MFPC requires the addition of GND wires, which generally means that a more bulky connector needs to be used, whereas in the present embodiment, the grounding route is directly guided to the cover plate 4 by the provision of the conductive functional area 2, shortening the grounding route and improving the ground efficiency without increasing the size of the connector between the flexible printed circuit board 10 and the main flexible printed circuit board, reducing costs.

In an exemplary embodiment, the binding area 11 comprises a signal connection pin 13 and a grounding pin 14 located on at least one side of the signal connection pin 13 in the second direction, the track area comprises a signal track 15 connected to the signal connection pin 13 and the grounding wire 16 located on at least one side of the signal track 15 in the second direction, and the grounding wire 16 and the corresponding conductive functional area 2 are located on a same side of the first region 1.

The extension direction of the signal track 15 is parallel to the first direction, the extension direction of the grounding wire 16 is parallel to the first direction, and in the second direction, the conductive functional area 2 is located on at least one side of the binding area 11, and the grounding pin 14 is located on one side of the signal connection pin 13, namely, the grounding pin 14 can be directly connected to the conductive functional area 2, facilitating the distribution of lines and simplifying the structural arrangement.

In the exemplary embodiment, the binding area 11 includes a plurality of the signal connection pins 13 arranged at intervals along the second direction, and in one embodiment, the plurality of the signal connection pins 13 are arranged at equal intervals, but not limited thereto.

In the exemplary embodiment, the spacing between the grounding pin 14 and its adjacent signal connection pin 13 is equal to, but not limited to, the spacing between any adjacent two of the signal connection pins 13.

In an exemplary embodiment, the flexible printed circuit board comprises a substrate layer 12, a first conductive layer 101 located at the first region 1, a second conductive layer 201 and a third conductive layer 202 located at the conductive functional area 2;

wherein the first conductive layer 101 is located on a first side of the substrate layer 12, and comprises the signal track 15, the signal connection pin 13, the grounding wire 16 and the grounding pin 14;

the second conductive layer 201 is located on the first side of the substrate layer 12, the second conductive layer 201 is arranged on a same layer as the first conductive layer 101, and the second conductive layer 201 is electrically connected to the grounding pin 14;

the third conductive layer 202 is located on a second side of the substrate layer 12 opposite to the first side, and the third conductive layer 202 and the second conductive layer 201 are electrically connected through a via hole 3 penetrating the substrate layer 12.

The substrate layer 12 may be made of a PI (polyimide) material, but is not limited thereto.

The first conductive layer 101 is made of a copper material, but is not limited thereto.

The conductive functional area 2 uses the arrangement of a double-layer conductive layer, the second conductive layer 201 and the first conductive layer 101 can be formed using a synchronous process, and the third conductive layer 202 and the second conductive layer 201 are connected through a via hole 3 so as to realize the connection with the grounding wire 16.

Copper plating is provided on the inner wall of the via hole 3 to form a connection conductive layer, and electrical connection between the second conductive layer 201 and the third conductive layer 202 is realized.

Both the second conductive layer 201 and the third conductive layer 202 may be made of a copper material, but this is not a limitation.

In an exemplary embodiment, the orthographic projection of the third conductive layer 202 on the substrate layer 12 at least partially overlaps the orthographic projection of the second conductive layer 201 on the substrate layer 12. The via hole 3 is arranged in overlapping regions to achieve an electrical connection of the second conductive layer 201 and the third conductive layer 202.

In an exemplary embodiment, the orthographic projection of the third conductive layer 202 on the substrate layer 12 is greater than or equal to the orthographic projection of the second conductive layer 201 on the substrate layer 12.

In use, the third conductive layer 202 is used to electrically connect with the fourth conductive layer 5 on the cover plate 4 to achieve grounding, so it is necessary to ensure the conductive area of the third conductive layer 202 to improve the grounding efficiency.

In an exemplary embodiment, the orthographic projection of the third conductive layer 202 on the substrate layer 12 coincides with the orthographic projection of the second conductive layer 201 on the substrate layer 12. Ensuring an overlapping region of the second conductive layer 201 and the third conductive layer 202 in a direction perpendicular to the substrate layer 12 facilitates the placement of the via holes 3 and, in turn, the connection of the second conductive layer 201 and the third conductive layer 202.

Illustratively, the diameter of the via holes 3, and the number of the via holes 3 can be set according to actual needs, and one or more via holes 3 can be provided on the substrate layer 12 to realize the electrical connection of the second conductive layer 201 and the third conductive layer 202.

In an exemplary embodiment, the side of the substrate layer 12 remote from the first conductive layer 101 is provided with an insulating protective layer 8.

The insulating protective layer 8 is connected to the substrate layer 12 via an AD adhesive layer 7, and the material of the AD adhesive layer may be PSA (pressure sensitive adhesive), but this is not a limitation.

In an exemplary embodiment, the first region 1 and the electrically conductive functional area 2 are integrally connected in a T-shaped configuration, the substrate layer 12 comprises a first side edge remote from the track area in the first direction, the electrically conductive functional area 2 comprises a second side edge on the same side as the first side edge in the first direction, the first side edge being flush with the second side edge.

In the second direction, at least one side of the first region 1 is provided with the conductive functional area 2, then the first region 1 and the conductive functional area 2 are integrally connected to form a T-shaped structure, and in the first direction, the conductive functional area 2 is located at one end of the first region 1 where the binding area 11 is provided, and the first side edge is flush with the second side edge to facilitate the overall aesthetics and spatial distribution of the flexible printed circuit board 10.

In an exemplary embodiment, the substrate layer 12 and the substrate layer 12 are joined to form a T-shaped substrate layer comprising a central region for disposing the first conductive layer 101 or the second conductive layer 201, and a peripheral region at the central region.

In the second direction, at least one side of the first region 1 is provided with the conductive functional area 2, and then the first region 1 and the conductive functional area 2 are integrally connected in a T-shaped structure.

The first region 1 and the conductive functional area 2 can use an integral structure, simplify the process arrangement; during the manufacturing process, the substrate layer 12 and the substrate layer 12 are integrally formed; the first conductive layer 101 and the second conductive layer 201 are formed on a first side of the substrate layer 12 using a synchronous process; the third conductive layer 202 is formed on a second side of the substrate layer 12 opposite to the first side, and then needs to be cut to obtain a desired shape, size, etc.; in order to avoid the risk of the particles formed by carbonization of the substrate layer 12 during cutting, such as short-circuiting of the conductive layer, it is required that the substrate layer 12 is flared, i.e., the T-shaped substrate layer comprises a central region for providing the first conductive layer 101 or the second conductive layer 201, and a peripheral region located in the central region, and the width of the peripheral region may be 0.2-0.3 mm, but this is not limiting.

Illustratively, the material used for the substrate layer 12 is PI (polyimide), but not limited thereto.

In an exemplary embodiment, in the second direction, the binding area 11 comprises a plurality of spaced apart signal connection pins 13, the grounding pins 14 being spaced apart from the signal connection pins 13 adjacent thereto.

The embodiments of the present disclosure also provide a display module, comprising a display panel, a cover plate 4 and the above-mentioned flexible printed circuit board 10 arranged between the display panel and the cover plate 4;

The flexible printed circuit board 10 is bound and connected to the display panel, the edge of the cover plate 4 is provided with a fourth conductive layer 5, and the conductive functional area 2 of the flexible printed circuit board 10 is electrically connected to the fourth conductive layer 5.

The conductive functional area 2 is connected to the fourth conductive layer 5 to achieve grounding, which is connected to the cover plate 4, and when used by a user, is in direct touch contact with the cover plate 4, and the generation of static electricity can be prevented while being grounded.

In order to further improve the grounding efficiency, the display module further comprises four frames surrounding the cover plate 4, wherein the frames can be metal frames, and the metal frames are in contact with the fourth conductive layer 5.

In an exemplary embodiment, the cover plate 4 comprises a first surface facing the display panel, a second surface facing away from the display panel, and a first side surface located between the first surface and the second surface, the first side surface being arranged close to the flexible printed circuit board 10, and the fourth conductive layer 5 comprises a first sub-conductive layer 51 arranged at an edge of the first surface close to the first side surface, a second sub-conductive layer 52 arranged at the first side surface, and a third sub-conductive layer 53 arranged at an edge of the second surface close to the first side surface;

The first sub-conductive layer 51, the second sub-conductive layer 52 and the third sub-conductive layer 53 are enclosed in a U-shaped structure.

The second surface is a touch surface of a user, and the fourth conductive layer 5 is divided into the first sub-conductive layer 51, the second sub-conductive layer 52 and the third sub-conductive layer 53, so as to effectively realize grounding.

In an exemplary embodiment, the cover plate 4 comprises a light-transmitting region corresponding to the display area of the display panel, and a light-shading region located at the periphery of the light-transmitting region, the orthographic projection of the first sub-conductive layer 51 on the cover plate 4 is located in the light-shading region, and the orthographic projection of the third sub-conductive layer 53 on the cover plate 4 is located in the light-shading region.

The orthographic projection of the third sub-conductive layer 53 on the cover plate 4 is located in the light-shading region, without exceeding the light-shading region, so as to avoid affecting the normal display of the display module.

Illustratively, the first surface and/or the second surface of the cover plate 4 is provided with an ink layer, which covers the light-shading region in order to effectively achieve light shielding against light leakage.

In an exemplary embodiment, the flexible printed circuit board 10 and the cover plate 4 are connected by an electrically conductive foam tape 6.

In the exemplary embodiment, the height of the conductive foam tape 6 is 0.3-0.4 mm in the direction perpendicular to the cover plate 4, which is not a limitation as long as the connection between the third conductive layer 202 and the fourth conductive layer 5 can be ensured without affecting the stability of the connection between the cover plate 4 and the display panel.

Illustratively, the light-emitting layer of the display panel is provided with a polarizer 200, the side of the polarizer 200 remote from the display panel being connected to the cover plate 4 via an optical glue layer 300.

In an exemplary embodiment, the orthographic projection of the conductive functional area 2 of the flexible printed circuit board 10 onto the cover plate 4 is located within the orthographic projection of the conductive foam tape 6 onto the cover plate 4.

With the above-mentioned solution, the connection area between the conductive foam tape 6 layer and the conductive functional area 2 is ensured, and the larger the contact area is, the smaller the impedance is, and in one embodiment, each side edge of the conductive foam tape 6 layer is externally expanded by 0.3-0.5 mm with respect to the corresponding side edge of the conductive functional area 2, but this is not a limitation.

Illustratively, the conductive functional area 2 is generally rectangular, and the area of the conductive functional area 2 is 2.8-4 $mm^2$, but this is not limiting.

In an exemplary embodiment, the display panel comprises a display substrate 100 and a touch-control substrate 200 located on a light-emitting side of the display substrate 100, and the flexible printed circuit board 10 is in a binding connection with the touch-control substrate 200.

The flexible printed circuit board further comprises a conductive adhesive 400, the flexible printed circuit board is connected to the touch-control substrate 200 via the conductive adhesive 400, and the conductive adhesive 400 is on a side of the first conductive layer 101 away from the substrate layer, and a side of the second conductive layer 201 away from the substrate layer.

Embodiments of the present disclosure also provide a display device including the display module described above.

It is to be understood that the above-described embodiments are merely exemplary embodiments that have been employed to illustrate the principles of the present disclosure, and that the disclosure is not limited thereto. It will be apparent to those skilled in the art that various modifications and variations can be made in the present disclosure without departing from the spirit or scope of the disclosure.

What is claimed is:

1. A flexible printed circuit board, comprising: a first region extending along a first direction, wherein the first region comprises a binding area and a track area arranged adjacent to each other along the first direction, at least one side of the binding area is provided with a conductive functional area along a second direction, the conductive functional area is electrically connected to a grounding wire in the track area for grounding, and the second direction is arranged at an angle to the first direction; and the flexible printed circuit board comprises a substrate layer, and the conductive functional area comprises two conductive layers located on at least one side of the substrate layer, and the two conductive layers are electrically connected with each other through a via hole;

wherein the binding area comprises a signal connection pin and a grounding pin located on at least one side of the signal connection pin in the second direction, the track area comprises a signal track connected to the signal connection pin and the grounding wire located on at least one side of the signal track in the second direction, and the grounding wire and the corresponding conductive functional area are located on a same side of the first region.

2. The flexible printed circuit board according to claim 1, comprising a substrate layer, a first conductive layer located in the first region, and a second conductive layer and a third conductive layer located in the conductive functional area;

the first conductive layer is located on a first side of the substrate layer and comprises the signal track, the signal connection pin, the grounding wire and the grounding pin;

the second conductive layer is located on the first side of the substrate layer, and the second conductive layer is electrically connected to the grounding pin; and the third conductive layer is located on a second side of the substrate layer opposite the first side, and the third conductive layer and the second conductive layer are electrically connected through a via hole penetrating the substrate layer.

3. The flexible printed circuit board according to claim 2, wherein an orthographic projection of the third conductive layer on the substrate layer at least partially overlaps an orthographic projection of the second conductive layer on the substrate layer.

4. The flexible printed circuit board according to claim 2, wherein an insulating protective layer is provided on a side of the substrate layer remote from the first conductive layer.

5. The flexible printed circuit board according to claim 2, wherein the first region and the conductive functional area are integrally connected in a T-shaped structure, the substrate layer comprises a first side edge away from the track area along the first direction, and along the first direction, the conductive functional area comprises a second side edge located on a same side as the first side edge, and the first side edge and the second side edge are flush.

6. The flexible printed circuit board according to claim 1, wherein in the second direction, the binding area includes a plurality of spaced apart signal connection pins, the grounding pins being spaced apart from signal connection pins adjacent thereto.

7. A display module, comprising a display panel, a cover plate, and the flexible printed circuit board of claim 1 arranged between the display panel and the cover plate; and the flexible printed circuit board is bound and connected to the display panel, an edge of the cover plate is provided with a fourth conductive layer, and the conductive functional area of the flexible printed circuit board is electrically connected to the fourth conductive layer.

8. The display module according to claim 7, wherein the cover plate comprises a first surface facing the display panel, a second surface away from the display panel, and a first side surface located between the first surface and the second surface, wherein the first side surface is arranged close to the flexible printed circuit board, and the fourth conductive layer comprises a first sub-conductive layer arranged at an edge of the first surface close to the first side surface, a second sub-conductive layer arranged at the first side surface, and a third sub-conductive layer arranged at an edge of the second surface close to the first side surface; and the first sub-conductive layer, the second sub-conductive layer and the third sub-conductive layer are in a U-shaped structure.

9. The display module according to claim 8, wherein the cover plate comprises a light-transmitting region corresponding to the display area of the display panel, and a light-shading region located at the periphery of the light-transmitting region, an orthographic projection of the first sub-conductive layer on the cover plate is located in the light-shading region, and an orthographic projection of the third sub-conductive layer on the cover plate is located in the light-shading region.

10. The display module according to claim 8, wherein the flexible printed circuit board and the cover plate are connected via a conductive foam tape.

11. The display module according to claim 10, wherein the conductive foam tape has a height of 0.3-0.4 mm in a direction perpendicular to the cover plate.

12. The display module according to claim 10, wherein the orthographic projection of the conductive functional area of the flexible printed circuit board on the cover plate is located in an orthographic projection of the conductive foam tape on the cover plate.

13. The display module according to claim 7, wherein the display panel comprises a display substrate and a touch-control substrate located on a light-emitting side of the display substrate, and the flexible printed circuit board is bound and connected to the touch-control substrate.

14. A display device comprising the display module of claim 1.

* * * * *